(12) United States Patent
Park

(10) Patent No.: US 6,849,552 B2
(45) Date of Patent: Feb. 1, 2005

(54) VERTICAL TYPE TRANSISTOR AND METHOD FOR FABRICATING THE SAME

(75) Inventor: Cheol Soo Park, Kyoungki-do (KR)

(73) Assignee: Dongbu Electronics Co., Ltd, Seoul (KR)

( * ) Notice: Subject to any disclaimer, the term of this patent is extended or adjusted under 35 U.S.C. 154(b) by 161 days.

(21) Appl. No.: 10/323,427

(22) Filed: Dec. 18, 2002

(65) Prior Publication Data

US 2003/0119327 A1 Jun. 26, 2003

(30) Foreign Application Priority Data

Dec. 20, 2001 (KR) .................................. 10-2001-0081789

(51) Int. Cl.⁷ ............................................ H01L 21/311
(52) U.S. Cl. ...................... 438/694; 438/201; 438/700
(58) Field of Search .................................. 438/694, 700, 438/706, 710, 719, 723, 201, 211, 212, 265, 268

(56) References Cited

U.S. PATENT DOCUMENTS

| | | | |
|---|---|---|---|
| 4,786,953 A | | 11/1988 | Morie et al. |
| 5,385,852 A | * | 1/1995 | Oppermann et al. ........ 438/270 |
| 6,239,465 B1 | * | 5/2001 | Nakagawa .................. 257/331 |
| 6,387,758 B1 | | 5/2002 | Yu et al. |
| 6,664,143 B2 | * | 12/2003 | Zhang ........................ 438/138 |
| 6,696,713 B2 | * | 2/2004 | Ishibashi .................... 257/296 |

* cited by examiner

Primary Examiner—Kin-Chan Chen
(74) Attorney, Agent, or Firm—Timothy J. Keefer; Seyfarth Shaw LLP

(57) ABSTRACT

A vertical type transistor and fabricating method therefor. An isolation oxide layer is formed on a field region in a silicon substrate to expose an active region, and an epitaxial silicon layer is formed on the active region of a source region is formed in the vicinity of the surface of the silicon substrate and a drain region is formed on the epitaxial silicon layer. A masking insulator spacer is formed at the side wall of stair part, and the epitaxial silicon layer exposed through the masking insulator spacer is removed. A gate insulating layer is formed along with the exposed surfaces of the epitaxial silicon layer, the source region, and the drain region. A gate electrode is formed to contact with the gate insulating layer. A planarization insulating layer is formed over whole structure, and contact holes and contact plugs are formed thereon.

7 Claims, 3 Drawing Sheets

VERTICAL TYPE TRANSISTOR AND METHOD FOR FABRICATING THE SAME

BACKGROUND OF THE INVENTION

1. Field of the Invention

The present invention relates to a transistor for a semiconductor integrated circuit device and fabricating method therefor, and more particularly to a vertical type transistor for a semiconductor integrated circuit device and fabricating method thereof, which is capable of high integration and has a new structure.

2. Description of the Prior Art

As generally known in the art, a semiconductor integrated circuit device generally employs a MOSFET (Metal Oxide Semiconductor Field Effect Transistor) as a unit transistor, and integrates lots of unit transistors into one identical semiconductor substrate to embody an integrated circuit. The transistors as explained above have horizontal type structures, and they rely on the lithography more and more and effective channels thereof are remarkably weakened along with the increase of the integration degree of the semiconductor device to result in the production of following several problems.

For example, as the channel of the transistor becomes shorter, there occurs a short channel effect that threshold voltages decrease or a reverse channel effect that threshold voltages increase, and a gate induced drain leakage (GIDL) phenomenon occurs in a semiconductor substrate using a thin gate oxide film.

Further, a punch through phenomenon increases, and when the transistor is not activated, leakage current ($I_{OFF}$) increases, also junction capacitance in a source/drain region increases, and change of the threshold voltage has occurred.

Additionally, various studies and developments have been performed in order to accomplish high current drivability, ultra high speed, and ultra low powers.

SUMMARY OF THE INVENTION

Accordingly, the present invention has been made to solve the above-mentioned problems occurring in the prior art, and an object of the present invention is to provide a vertical type transistor for a semiconductor integrated circuit and fabricating method therefor, which is capable of high integration and has a new structure.

In order to accomplish this object, there is provided a vertical type transistor in a semiconductor integrated circuit device, comprising: an isolation oxide layer formed on a silicon substrate and exposing an active region, an epitaxial silicon layer exposing apart of the active region and formed along the isolation oxide layer from the surface of the silicon substrate, a source region formed in the vicinity of the surface of the silicon substrate and a drain region formed on the epitaxial silicon layer, a gate insulating layer formed along the exposed surfaces of the epitaxial silicon layer, the source region, and the drain region, a gate electrode formed to contact with the gate insulating layer arranged vertically between the source region and the drain region, a planarization insulating layer formed over the whole structure of the produced elements and including contact holes that expose the source region, the drain region and the gate electrode respectively, and contact plugs formed in the contact holes and electrically connected with the source region, the drain region, and the gate electrode respectively.

In accordance with another aspect of the present invention, there is also provided a method for fabricating a vertical type transistor, comprising the steps of: forming an isolation oxide layer formed on a field region in a silicon substrate to expose an active region of the silicon substrate, forming an epitaxial silicon layer on the active region of the silicon substrate, performing an ion implantation to form the source region in the vicinity of the surface of the silicon substrate and the drain region on the epitaxial silicon layer, forming a masking insulator spacer at the side wall of a stair part, the stair part that has a height difference being made by removing the drain region to a desired depth, removing the epitaxial silicon layer exposed through the masking insulator spacer so that the source region can be exposed, forming a gate insulating layer along with the exposed surfaces of the epitaxial silicon layer, the source region, and the drain region after the removal of the masking insulator spacer, forming a gate electrode to contact with the gate insulating layer vertically arranged between the source region and the drain region, forming a planarization insulating layer over whole structure of the produced elements, forming contact holes on the planarization insulating layer to expose the source region, the drain region, and the gate electrode respectively, and forming contact plugs in the contact holes so that they are electrically connected with the source region, the drain region, and the gate electrode.

Also, the epitaxial silicon layer is formed through a selective epitaxial growth method, and the forming step of the epitaxial silicon layer comprises the step of in-situ doping to control a threshold voltage of a channel.

In accordance with the present invention, the method for fabricating a vertical transistor in a semiconductor integrated circuit device further comprises a step of performing a sacrificial oxidation after removing the exposed epitaxial silicon layer, and steps of depositing an oxide layer and annealing in order to control the threshold voltage of the channel. In this instance, the annealing is carried out by using a furnace or an RTA method. According to the present invention, the gate electrode forming step further comprises first step of depositing materials for the gate electrode and second step of performing an etch-back process.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, a preferred embodiment of the present invention will be described with reference to the accompanying drawings.

Figure 1:
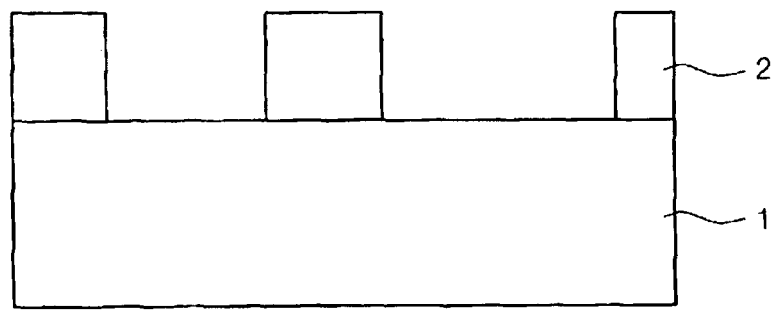
FIGS. 1 to 4 are sectional views showing steps of a process for fabricating a vertical type transistor in a semiconductor integrated circuit device in accordance with the present invention.

Referring to FIG. 1, a thick isolation oxide layer 2 is first formed on a field region of a silicon substrate 1. In this instance, the isolation oxide layer 2 may be produced by first forming an oxide layer on an entire surface of the silicon substrate 1 by thermal oxidation, and then removing an exposed part by anisotropic dry etch after covering the oxide layer with a mask.

Figure 2:
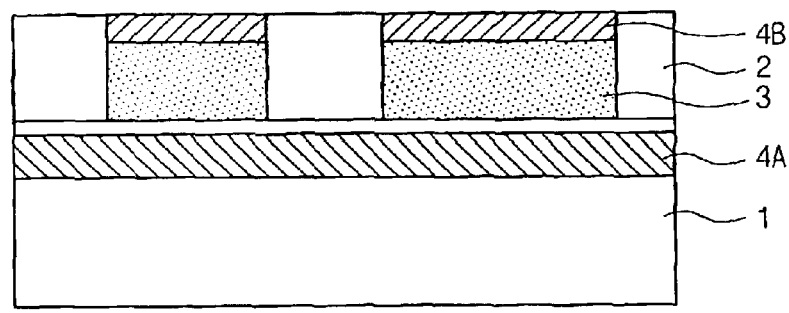

Then, as shown in FIG. 2, an epitaxial silicon layer 3 is formed on an exposed region (active region) of the silicon substrate 1, and successively a source region 4A and a drain region 4B are formed through ion implantation properly. In this instance, the epitaxial silicon layer 3 is formed by employing the silicon substrate 1 as a seed through selective epitaxial growth (SEG) method, and it is desirous to perform an in-situ doping process. The source region 4A is formed in the vicinity of the surface of the silicon substrate 1 and the drain region 4B is formed on the epitaxial silicon layer 3. This formation of the source region 4A and the drain region 4B may be achieved by controlling ion implantation energy properly.

Figure 3:
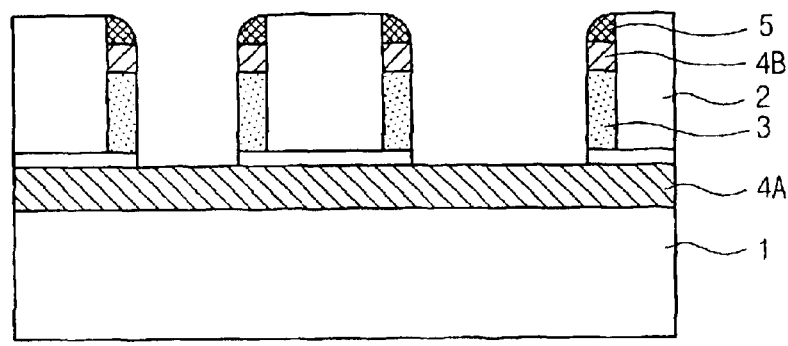

Next, as shown in FIG. 3, a stair part that has a height difference and positioned below the isolation oxide layer 2 is formed by removing the drain region 4B to a certain depth through a blanket dry etch method, and then a masking insulator spacer 5 is formed at side wall of the stair part by the blanket dry etch of a masking insulator deposited on the side wall.

Subsequently, the epitaxial silicon layer 3 exposed by the masking insulator spacer 5 is removed by dry etch to expose the source region 4A. Accordingly, a part of the active region in the epitaxial silicon layer 3 is exposed and remained along the side wall of the isolation oxide layer 2 from the surface of the silicon substrate 1. In this instance, the dry etch utilizes a high selection ration of the dry etch, and when a part of the epitaxial silicon layer 3 on which a channel will be formed is spoiled, the spoiled part is recovered by performing a sacrificial oxidation process, and the sacrificial oxide layer is removed by a cleansing process before forming a gate insulation layer.

According to this embodiment of the present invention, the source region 4A and the drain region 4B have been doped to a high concentration of more than $10^{15}$ atoms/cm$^2$. Therefore, a thermal oxide layer having a thickness of some hundreds Å has been formed during the sacrificial oxide process and the gate oxidation process. In particular, the threshold voltage (Vth) of a channel is controlled by adjusting amounts of a dose in an in-situ doping process when the epitaxial silicon layer 3 is formed, and when an additional controlling is required, the threshold voltage can be controlled through depositing an oxide layer such as a BSG (Boron Silicate Glass) or a PSG (Phosphorous Silicate Glass) after removing the sacrificial oxide layer and subjecting to annealing treatment with controlling the temperature and the time of the annealing. Then, the thermal oxide layer and the BSG or the PSG oxide layer are removed by using an etch solution of high selection ratio of wet etch, resulting in loss of oxide layer formed by thermal oxidation within some tens Å. In this instance, the annealing treatment can be performed by using a furnace or an RTA (Rapid Thermal Annealing) method.

Figure 4:
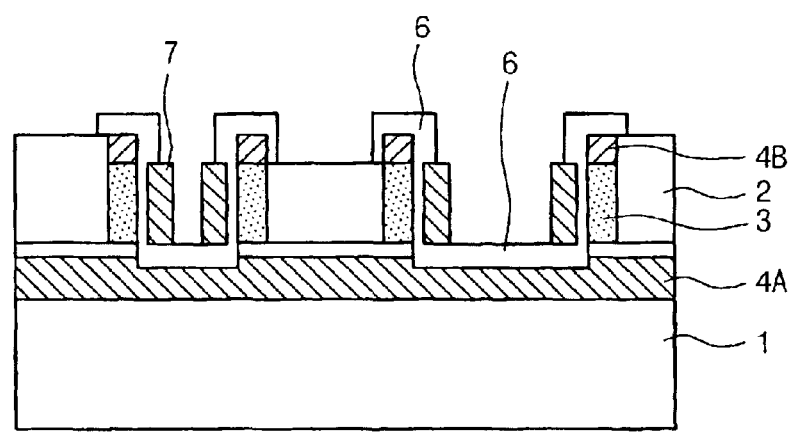

Referring to FIG. 4, a gate insulation oxide layer 6 and a gate electrode 7 are successively formed after the removal of the masking insulator spacer. In this instance, the gate insulating oxide layer 6 is formed by a thermal oxidation method along surfaces of the exposed epitaxial silicon layer 3, the source region 4A, and the drain region 4B. The gate electrode 7 is formed by etch-back process after the deposition of materials for the gate electrode to result in contacting with the gate insulating oxide layer 6 arranged vertically between the source region 4A and the drain region 4B.

Figure 5:
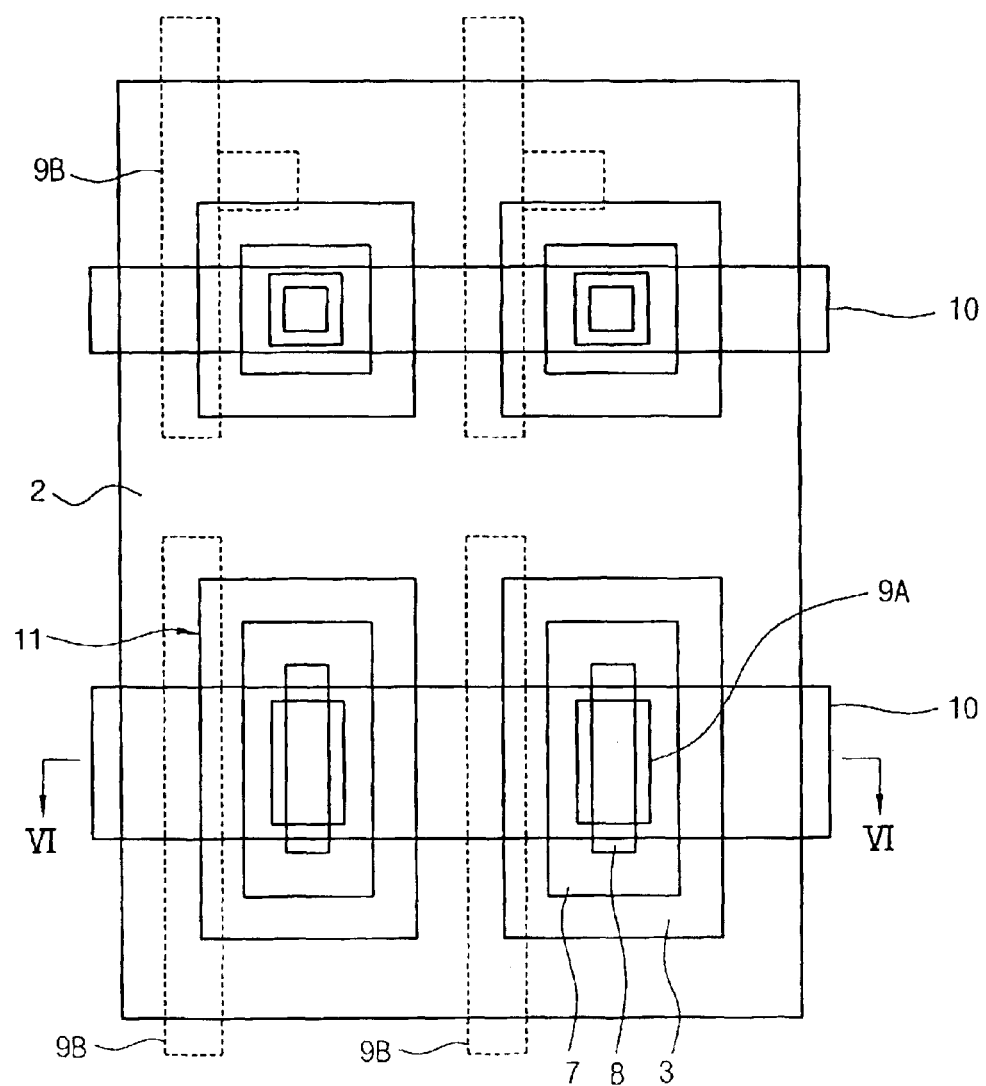
FIG. 5 is a planar view showing a lay-out of a vertical type transistor in a semiconductor integrated circuit device in accordance with the present invention.
Figure 6:
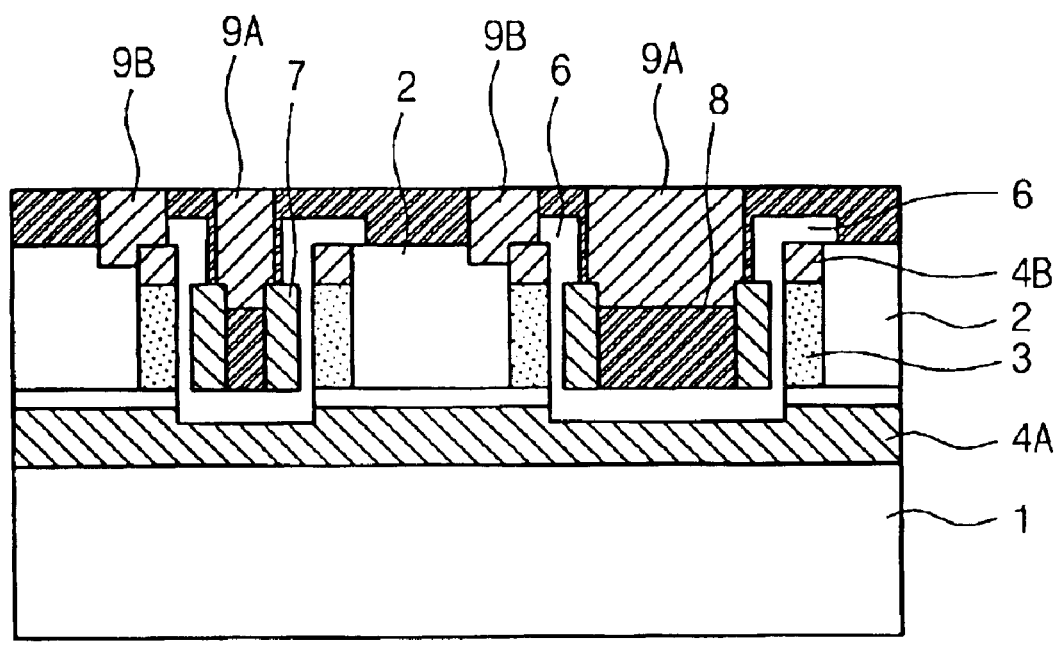
FIG. 6 is a sectional view taken along line VI—VI in FIG. 5.

Referring now to FIGS. 5 and 6, a planarization insulating layer 8 is deposited over whole structure of the device and flattened through a CMP (Chemical-Mechanical Polishing) processing, and contact holes and contact plugs 9A, 9B are formed in a desired region of the planarization insulating layer 8. The contact holes expose the source region 4A, the drain region 4B, and the gate electrode 7 respectively, to result in electrical connection between the contact plugs 9A, 9B and the source region 4A, drain region 4B, and the gate electrode 7. In FIGS. 5 and 6, the numerals 9A, 9B refer to a gate contact plug and a drain contact plug, the numeral 10 refers to a gate line and the numeral 11 refers to an active region, but a source contact plug is not shown.

Then, a transistor in a semiconductor integrated circuit device is produced by forming respective wiring with conventional technologies.

In accordance with the method for fabricating a vertical type transistor in a semiconductor integrated circuit device of the present invention, it is easy to control the threshold voltage of the channel, and the decrease of the effective length of the channel results in improvement of the electrical characteristics such as the short channel effect.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method for fabricating a vertical type transistor in a semiconductor integrated circuit device, the method comprising the steps of:

forming an isolation oxide layer formed on a field region in a silicon substrate to expose an active region of the silicon substrate;

forming an epitaxial silicon layer on the active region of the silicon substrate;

performing an ion implantation to form the source region in the vicinity of the surface of the silicon substrate and the drain region on the epitaxial silicon layer;

forming a masking insulator spacer at the side wall of a stair part, the stair part that has a height difference being made by removing the drain region to a desired depth;

removing the epitaxial silicon layer exposed through the masking insulator spacer so that the source region can be exposed;

forming a gate insulating layer along with the exposed surfaces of the epitaxial silicon layer, the source region, and the drain region after the removal of the masking insulator spacer;

forming a gate electrode to contact with the gate insulating layer vertically arranged between the source region and the drain region;

forming a planarization insulating layer over whole structure of the produced elements;

forming contact holes on the planarization insulating layer to expose the source region, the drain region, and the gate electrode respectively;

forming contact plugs in the contact holes so that they are electrically connected with the source region, the drain region, and the gate electrode.

2. The method for fabricating a vertical type transistor according to claim 1, wherein the epitaxial silicon layer is formed through a selective epitaxial growth method.

3. The method for fabricating a vertical type transistor according to claim 1, wherein the forming step of the epitaxial silicon layer comprises the step of in-situ doping to control a threshold voltage of a channel.

4. The method for fabricating a vertical type transistor according to claim 1, further comprising a step of performing a sacrificial oxidation after removing the exposed epitaxial silicon layer.

5. The method for fabricating a vertical type transistor according to claim 4, further comprising steps of depositing an oxide layer and annealing in order to control the threshold voltage of the channel.

6. The method for fabricating a vertical type transistor according to claim 5, wherein the annealing is carried out using a furnace or an RTA method.

7. The method for fabricating a vertical type transistor according to claim 1, wherein the gate electrode forming step comprises first step of depositing materials for the gate electrode and second step of performing an etch-back process.

* * * * *